(12) United States Patent
Kasai et al.

(10) Patent No.: US 8,084,921 B2
(45) Date of Patent: Dec. 27, 2011

(54) ULTRASONIC MOTOR DRIVE APPARATUS

(75) Inventors: Yasuaki Kasai, Saitama (JP); Nagahide Sakai, Higashimurayama (JP)

(73) Assignee: Olympus Corporation, Tokyo (JP)

( * ) Notice: Subject to any disclaimer, the term of this patent is extended or adjusted under 35 U.S.C. 154(b) by 211 days.

(21) Appl. No.: 12/692,146

(22) Filed: Jan. 22, 2010

(65) Prior Publication Data
US 2010/0187950 A1   Jul. 29, 2010

(30) Foreign Application Priority Data

Jan. 26, 2009  (JP) ................................. 2009-014213

(51) Int. Cl.
*H02N 2/00* (2006.01)
(52) U.S. Cl. ......... 310/323.14; 310/323.01; 310/323.05; 310/323.16; 310/323.17
(58) Field of Classification Search ............. 310/323.01, 310/323.02, 323.05, 323.06, 323.09, 323.14, 310/323.16, 323.17
See application file for complete search history.

(56) References Cited

U.S. PATENT DOCUMENTS

| | | | |
|---|---|---|---|
| 2008/0238249 A1* | 10/2008 | Takahashi et al. | 310/317 |
| 2009/0225388 A1* | 9/2009 | Zaifrani et al. | 359/225.1 |
| 2009/0256445 A1* | 10/2009 | Kotani et al. | 310/323.16 |
| 2009/0267455 A1* | 10/2009 | Takasan et al. | 310/323.16 |
| 2010/0084944 A1* | 4/2010 | Suzuki | 310/323.02 |

FOREIGN PATENT DOCUMENTS

JP   2005-143176   6/2005

* cited by examiner

*Primary Examiner* — Thomas M Dougherty
(74) *Attorney, Agent, or Firm* — Scully, Scott, Murphy & Presser, P.C.

(57) ABSTRACT

An ultrasonic motor drive apparatus comprises a piezoelectric element 107 having a plurality of piezoelectrically active regions, in which longitudinal vibration and flexural vibration are induced with application of alternate signals to the plurality of piezoelectrically active regions, a piezoelectric element holder 108 that is fixedly attached to the piezoelectric element, covering the neighborhood of a common node of the longitudinal vibration and the flexural vibration induced in the piezoelectric element all along the circumference of the central portion of the piezoelectric element with respect to the longitudinal direction, a vibrator holder 103 having a plurality of openings, a driven member 104 having a substantially spherical shape, an output shaft 106 attached to the driven member, through which power output of the driven member is transmitted, a pressing member 102 that brings the driven member 104 and the piezoelectric member into pressure contact with each other along the third direction, a cap 105 having an opening 105a, a link member 101 one end of which is connected with the pressing member 102 along the third direction and the other end of which can be connected with another apparatus, and a control section 600 that applies an alternate signal to the piezoelectric member.

8 Claims, 7 Drawing Sheets

ULTRASONIC MOTOR DRIVE APPARATUS

CROSS-REFERENCE TO RELATED APPLICATION

The present application is based upon and claims the benefit of priority from the prior Japanese Patent Application No. 2009-014213 filed on Jan. 26, 2009; the entire contents of which are incorporated herein by reference.

BACKGROUND OF THE INVENTION

1. Field of the Invention

The present invention relates an ultrasonic motor drive apparatus.

2. Description of the Related Art

An ultrasonic motor has a vibration member including an ultrasonic vibrator and a moving member that is in contact with the vibration member. Vibration is induced in a vibration member with the application of voltage, whereby a moving member (which will be sometimes referred to as a "driven member" hereinafter) is driven by the vibration by friction. Ultrasonic motors having a spherical driven member through which output power is transmitted are used as drive sources having multiple degrees of freedom in apparatuses such as robot arms and articulated mechanisms. Other various applications of ultrasonic motors are expected.

For example, Japanese Patent Application Laid-Open No. 2005-143176 discloses a rotational drive apparatus shown in FIG. 7. The rotational drive apparatus is composed of a vibration member 20, a frame 23 for the vibration member, a vibration member support means 24, a leaner stage 25, an arm 22, a zirconia ball 21 having a substantially spherical surface, an annular member 29, and other components and can be driven about multiple axes.

In this prior art apparatus, the linear stage 25, a screw 27 serving as a mechanism for applying pressure, a spring 28, the zirconia ball 21, and the annular member 29 are attached to the arm 22. In consequence, these components have respective degrees of freedom of assembly.

Therefore, this apparatus suffers from the problem that it requires great efforts to align the center axis L of the apparatus and the axes of the aforementioned components as assembled.

SUMMARY OF THE INVENTION

The present invention has been made in view of the above-described problem and has an object to provide an ultrasonic motor drive apparatus that can drive a driven member with multiple degrees of freedom (or multiple axes) by a single piezoelectric element and can be assembled easily with a decreased number of degrees of freedom in assembly.

To solve the above-described problem and achieve the above object, according to the present invention, there is provided an ultrasonic motor drive apparatus comprising:

a piezoelectric element of a cuboidal shape having a plurality of piezoelectrically active regions arranged along a first direction and a plurality of piezoelectrically active regions arranged along a second direction, in which longitudinal vibration and flexural vibration are induced with application of alternate signals to the plurality of piezoelectrically active regions;

a piezoelectric element holder that is fixedly attached to the piezoelectric element at a position on and in the vicinity of a common node of the longitudinal vibration and the flexural vibration induced in the piezoelectric element;

a vibrator holder having a plurality of openings provided along a plane perpendicular to a third directional axis;

a driven member having a substantially spherical shape that is rotationally driven by elliptical vibration generated by synthesis of the longitudinal vibration and flexural vibration induced on an end face of the piezoelectric element with respect to the third direction;

an output shaft that is attached to the driven member and movable along the third direction in a certain range to transmit power output of the driven member;

a pressing member that brings the driven member and the piezoelectric member into pressure contact with each other with a pressing force acting therebetween along the third direction;

a cap having an opening and disposed at a position opposed to the piezoelectric member and the pressing member with the driven member between along the third direction, the cap receiving a pressing force while guiding the driven member;

a link member one end of which is connected with the pressing member along the third direction and the other end of which can be connected with another apparatus; and a control section that applies an alternate signal to the piezoelectric member.

According to a preferred mode of the present invention, it is preferred that the piezoelectric element holder be cylindrical in shape and have a substantially cuboidal piezoelectric element insertion opening provided therein into which the piezoelectric element is to be fitted.

According to a preferred mode of the present invention, it is preferred that the piezoelectric element holder has two projecting portions that allow the piezoelectric element to which the piezoelectric element holder is attached to be placed in the vibrator holder by the plurality of openings and guided to a position on the third directional axis, the projecting portions being provided at positions at which a center line passing through the center of a circle and the circle intersect.

According to a preferred mode of the present invention, it is preferred that the piezoelectric element holder be made of a resin material or an engineering plastic material.

According to a preferred mode of the present invention, it is preferred that the plurality of openings of the vibrator holder include a first opening provided along the plane perpendicular to the third directional axis, wherein as the piezoelectric element on which the piezoelectric element holder is fixedly attached is dropped through the first opening, the orientation of the piezoelectric element be regulated and the piezoelectric element be introduced into the vibrator holder.

According to a preferred mode of the present invention, it is preferred that the plurality of openings of the vibrator holder include a plurality of second openings that are perpendicular to the third direction and the first direction and provided at positions symmetrical with respect to the third directional axis, engagement of the second openings and the plurality of projecting portions of the piezoelectric element holder cause the piezoelectric element to be placed in the vibrator holder through the first opening, and the center of the piezoelectric member thus guided and the center of the vibrator holder be aligned along the third direction by the second openings.

According to a preferred mode of the present invention, it is preferred that in a state in which the plurality of second openings of the vibrator holder and the plurality of projecting portions of the piezoelectric element holder are in engagement with each other, positioning of the piezoelectric member in the vibrator holder be achieved, the piezoelectric element can move along the third direction, and a structure that allows adjustment of the pressing force by the pressing member and a rotation prevention structure that prevents the piezoelectric member to rotate about the third directional axis be further provided.

According to a preferred mode of the present invention, it is preferred that the link member can be connected with an output shaft of another ultrasonic motor drive apparatus.

DETAILED DESCRIPTION OF THE INVENTION

In the following, an embodiment of the ultrasonic motor drive apparatus according to the present invention will be described in detail with reference to the drawings. It should be understood that the present invention is not limited by the embodiment.

Figure 1:
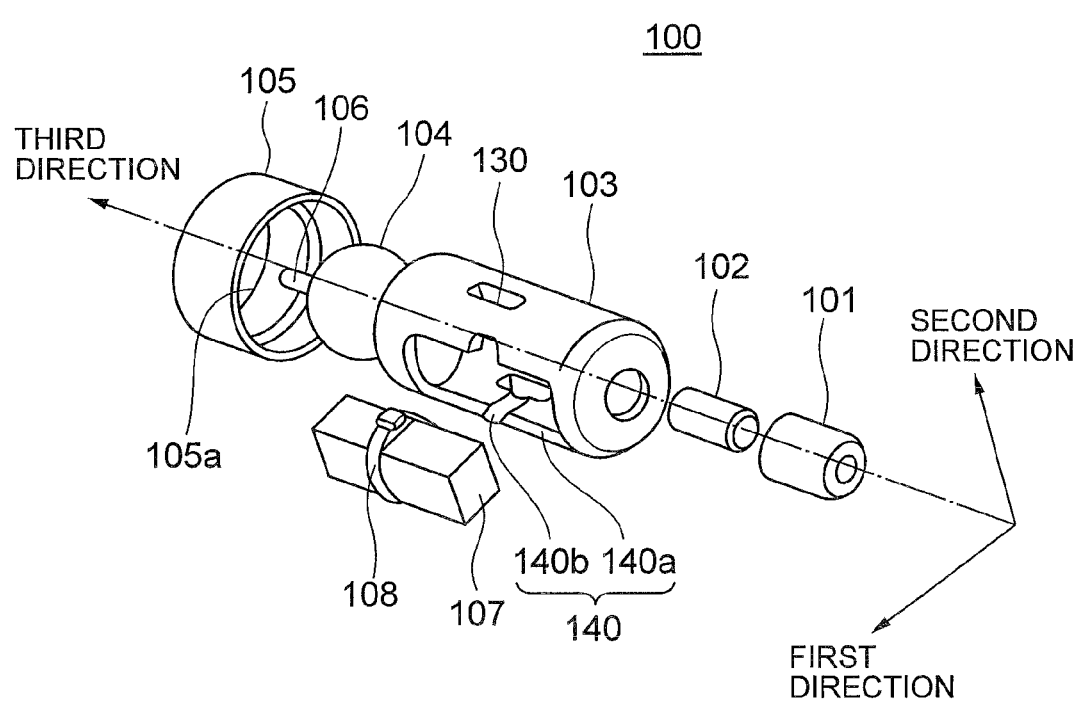
FIG. 1 is an exploded perspective view of an ultrasonic motor drive apparatus according to an embodiment of the present invention.

FIG. 1 is an exploded perspective view of an ultrasonic motor drive apparatus 100 according to an embodiment of the present invention. To facilitate the description, three directional axes, or the first, second, and third directional axes that are perpendicular to each other are set to indicate the first, second, and third directions.

The apparatus 100 includes a piezoelectric element 107 in which longitudinal vibration and flexural vibration are induced. A piezoelectric element holder 108 is fixedly attached to the piezoelectric element 107 at a position on or in the vicinity of a common node of the longitudinal vibration and the flexural vibration induced therein. A vibrator holder 103 is formed of a hollow cylindrical member. A vibrator holder 103 has a plurality of openings provided toward the first directional axis and the second directional axis along a plane perpendicular to the third directional axis. The plurality of openings include a first opening 140 and second openings 130.

The apparatus 100 also includes a driven member 104 having a substantially spherical shape, which is rotationally driven by elliptical vibration generated on the end surface of the piezoelectric element 107 with respect to the third direction by the synthesis of the longitudinal vibration and the flexural vibration induced in the piezoelectric element 107. To the driven member 104 is attached an output shaft 106 through which the power output is transmitted. The output shaft 106 is movable over a certain range with respect to the third direction.

The material of the driven member 104 may be a ceramic-based material, metal, or magnet. The output shaft 106 through which the power output is transmitted is attached to the driven member 104 by screw engagement or adhesion. The end of the output shaft 106 may suitably adapted to the apparatus connected thereto.

The apparatus 100 also has a pressing member 102, which creates a pressing force acting between the driven member 104 and the piezoelectric element 107 along the third direction to bring them into pressure contact with each other. The apparatus 100 also includes a cap 105 having an opening portion 105a. Since the cap 105, the driven member 104, the piezoelectric element 107, and the pressing member 102 are arranged along the third direction, the pressing force exerted by the pressing member 102 acts on the cap 105, while the driven member 104 is guided by the opening portion 105a provided on the cap 105.

The apparatus 100 also includes a link member 101, one end of which is joined to the pressing member 102 along the third direction and the other end of which can be connected to another apparatus. A control portion that will be described later supplies an alternate signal to the piezoelectric element 107.

Figures 2A, 2B:
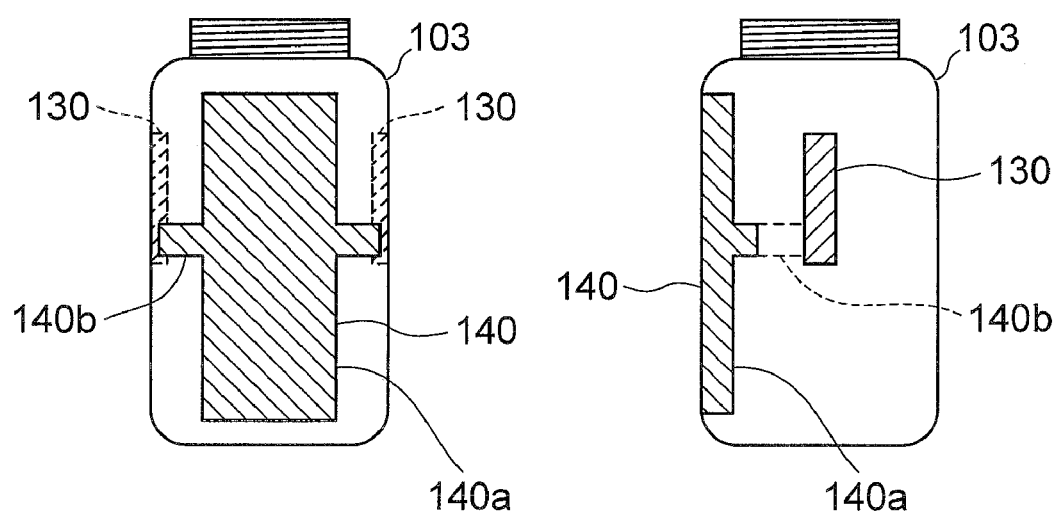
FIGS. 2A and 2B show the overall structure of a vibrator holder.

The vibrator holder 103 will be described with reference to FIGS. 1, 2A, and 2B. As shown in FIG. 1, the vibrator holder 103 has the first opening 140 having a cross-shape composed of a first portion 140a that extends along the third directional axis and the first directional axis and passes through the wall of the vibrator holder 103, and a second portion 140b that extends perpendicularly to the third directional axis and along the first directional axis and ends halfway in the wall of the vibrator holder 103. The vibrator holder 103 also has the second openings 130 that open in the second direction and are located at positions symmetrical with respect to the third directional axis. As shown in FIGS. 2A and 2B, helical screw threads for engagement with the cap 105 are provided on the upper end portion of the vibrator holder 103. Furthermore, the vibrator holder 103 has a hole provided at the center of the bottom thereof, to which the pressing member 102 is to be attached.

The pressing member 102 may include a combination of a coil spring and a screw, or a ball plunger, and is adapted to create a certain pressing force acting between the driven member 104 and the piezoelectric element 107. The link member 101 is adapted to be connected with the pressing member 102 at one end and with another ultrasonic motor drive apparatus or other apparatus at the other end.

The cap 105 has an opening 105a that serves as a receiver portion for receiving the driven member 104 and screw threads for engagement with the vibrator holder 103.

Figure 3:
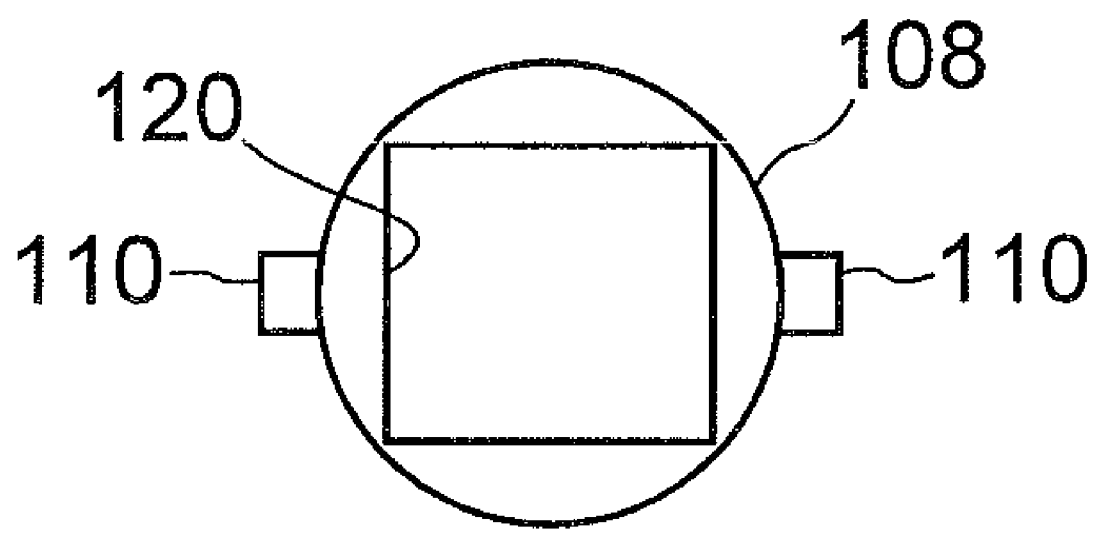
FIG. 3 is a cross sectional view showing the relationship between a piezoelectric element and a piezoelectric element holder.

The piezoelectric element holder 108 is a cylindrical member having a piezoelectric element insertion opening 120 having a substantially rectangular shape and projecting portions 110 provided at two positions at which a diameter passing through the center of the circle shown in FIG. 3 and the outer circumference of the circle intersect (i.e. at positions opposed to each other along a diametrical direction).

Figure 4:
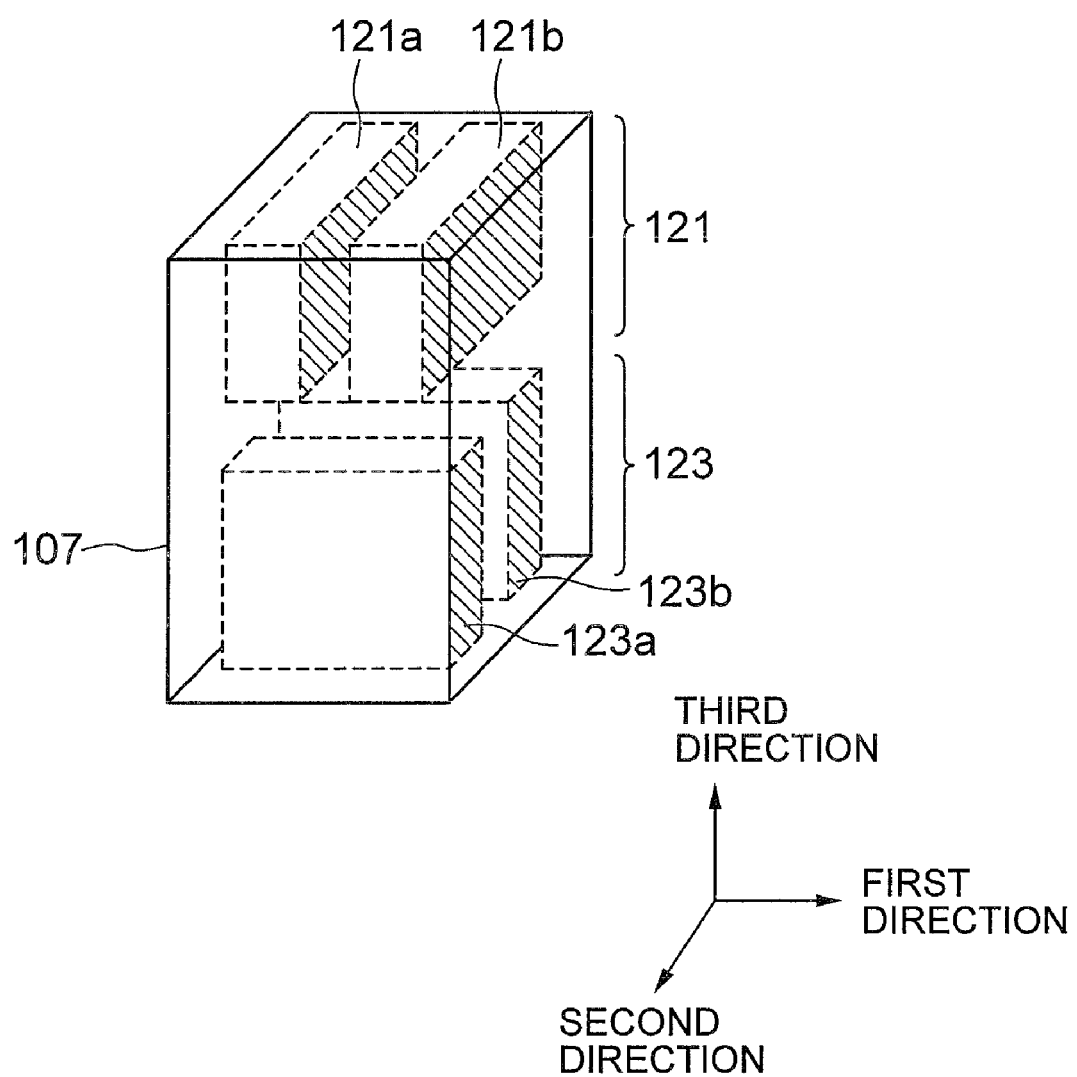
FIG. 4 is a diagram schematically showing the construction of the piezoelectric element.

FIG. 4 shows the internal constitution of the piezoelectric element 107. The piezoelectric element 107 has two piezoelectrically active regions 121a, 121b which are substantially rectangular shape arranged along the first direction and other two piezoelectrically active regions 123a, 123b arranged along the second direction. The piezoelectric element 107 is inserted or fitted in the piezoelectric element insertion opening 120 of the piezoelectric element holder 108. Thus, the center of the piezoelectric element holder 108 and the center of the piezoelectric element 107 can be aligned with each other.

The piezoelectric element holder 108 is fixed on the piezoelectric member 107 at a position on and in the vicinity of a common node of the longitudinal vibration and the flexural vibration induced therein. It is preferred that the material of the piezoelectric element holder 108 be a resin material.

Figure 5:
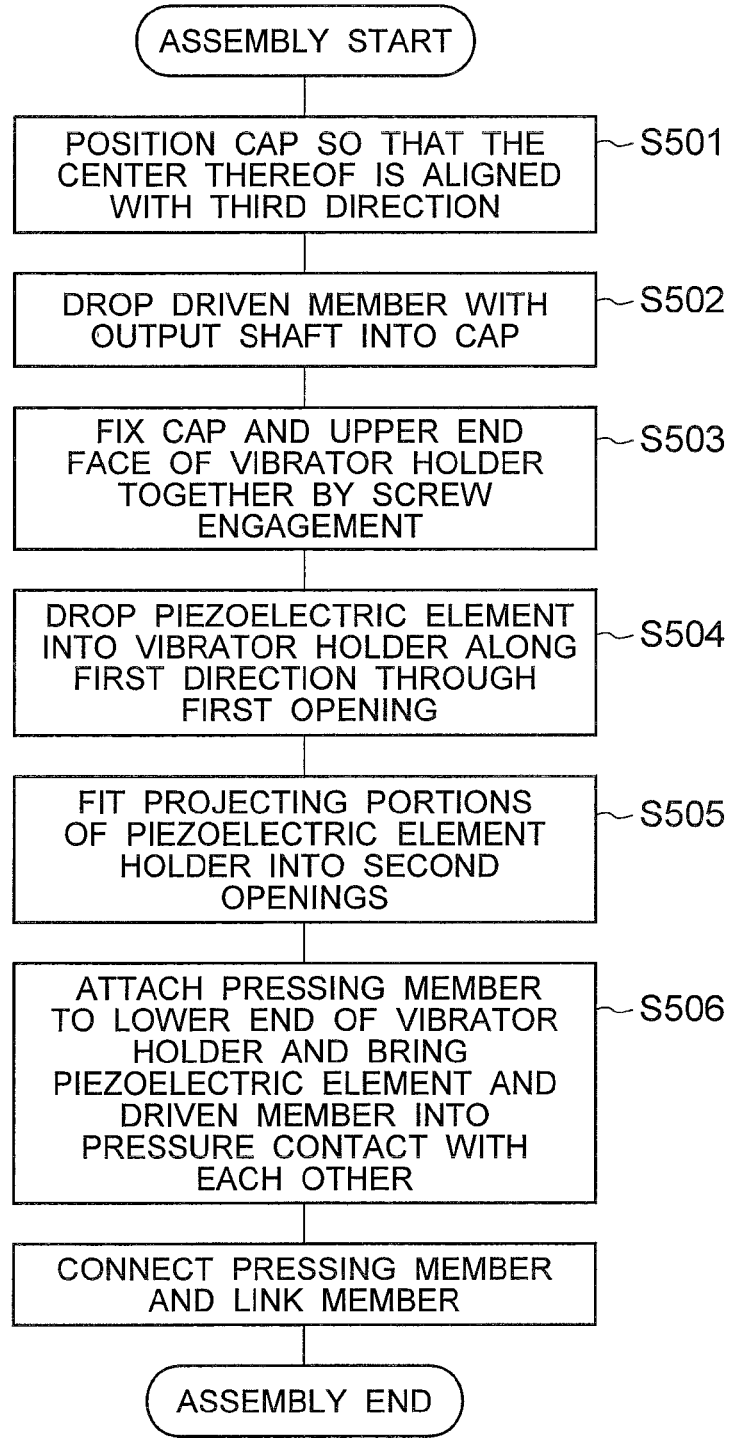
FIG. 5 is a flow chart of an assembly process.

In the following, a process of assembling the ultrasonic motor drive apparatus will be described with reference to the flow chart of FIG. 5. Here, it is assumed that the output shaft 106 has already been attached to the driven member 104 by screw engagement or adhesion, and the piezoelectric element holder 108 and the piezoelectric element 107 have already been assembled together, before the assembling process described in the following is started.

The assembling process basically includes sequential steps of assembling the components in order while aligning the center of each component with the center axis (which is identical to the third directional axis shown in FIG. 1) of the ultrasonic motor drive apparatus 100. However, the assembly worker need not be strictly careful about the centers of the component (in other words, the centers of the components need not be strictly aligned with each other) as long as the assembly process is performed according to the flow chart of FIG. 5.

In step S501, the cap 105 is positioned in such a way that the center thereof is aligned with the third direction.

In step S502, the driven member 104 to which the output shaft 106 has been attached is dropped into the cap 105 along the third direction. Here, the driven member 104 with the output shaft 106 is dropped in so that the output shaft 106 extends out of the cap 105 (the left side thereof, in FIG. 1). The cap 105 and the driven member 104 are designed in such a way that the center of the cap 105 and the center of the driven member 104 are aligned with each other as the driven member 104 is dropped into the cap 105.

In step S503, the cap 105 in which the driven member 104 that has been dropped in is received and the vibrator holder 103 are fixed together by screw threading along the third direction. Specifically, the screw threads provided on the upper end portion of the vibrator holder 103 and the screw threads provided on the cap 105 are meshed with each other.

Then, in step S504, the piezoelectric element 107 on which the piezoelectric element holder 108 is attached is dropped into the vibrator holder 103 along the first direction through the first opening 140 of the vibrator holder 103.

In step S505, the piezoelectric element 107 with the piezoelectric element holder 108 thus dropped through the first opening 140 is pushed along the first direction to the position at which the engagement of the two projecting portions 110 of the piezoelectric element holder 108 and the second openings 130 is achieved. As the piezoelectric element 107 with the piezoelectric element holder 108 is pushed and guided to the position at which the engagement of the two projecting portions 110 of the piezoelectric element holder 108 and the second opening 130 is achieved, the center of the driven member 104, the center of the piezoelectric element 107, and the center of the vibrator holder 103 are positioned to be aligned substantially with each other.

The two projecting portions 110 of the piezoelectric element holder 107 and the second openings 130 engaging with each other serves as a structure that prevents rotation of the piezoelectric element 107 about the third directional axis and a guide structure that allows the movement of the piezoelectric element 107 along the third directional axis as well as the positioning structure.

In step 506, the pressing member 102 is screwed to the hole provided on the lower end face of the vibrator holder 103 with respect to the third direction (i.e. the right end face of the vibrator holder in FIG. 1) for connection with the pressing member 102. Thus, the pressing member 102 is brought into contact with the center of the lower end face of the piezoelectric element 107. Specifically, as the pressing member 102 is screwed into the vibrator holder 103, the piezoelectric element 107 is displaced toward the driven member 104 with the aid of the guide structure described in connection with step S505.

As the pressing member 102 is further screwed into the vibrator holder 103, the piezoelectric element 107 and the driven member 104 are brought into pressure contact with each other with there centers being substantially aligned. After the pressure contact of them is achieved, the pressing force therebetween is adjusted to a specific optimum value (which has been determined beforehand) based on the spring constant and the pitch of the screw threads.

In step S507, the link member 101 is attached to the pressing member 102.

As per the above, the ultrasonic motor drive apparatus having multiple degrees of freedom can be produced easily by assembling the components sequentially in the order of the steps S501 to 5506.

According to the present invention, the number of degrees of freedom in assembly can be reduced thanks to the provision of the first opening 140 and the second openings 130 on the vibrator holder 103, the provision of the projecting portions 110 on the piezoelectric element holder 108, and the assembly along the third direction.

As described above, multiple functions (i.e. the functions of positioning the piezoelectric element, adjusting the pressing force, and preventing rotation of the piezoelectric element) can be provided by a simple structure. This provides a great advantage in facilitating the assembly. Furthermore, the adjustment of the pressing force exerted on the piezoelectric element 107 can easily be adjusted in the apparatus according to the present invention.

Figure 6:
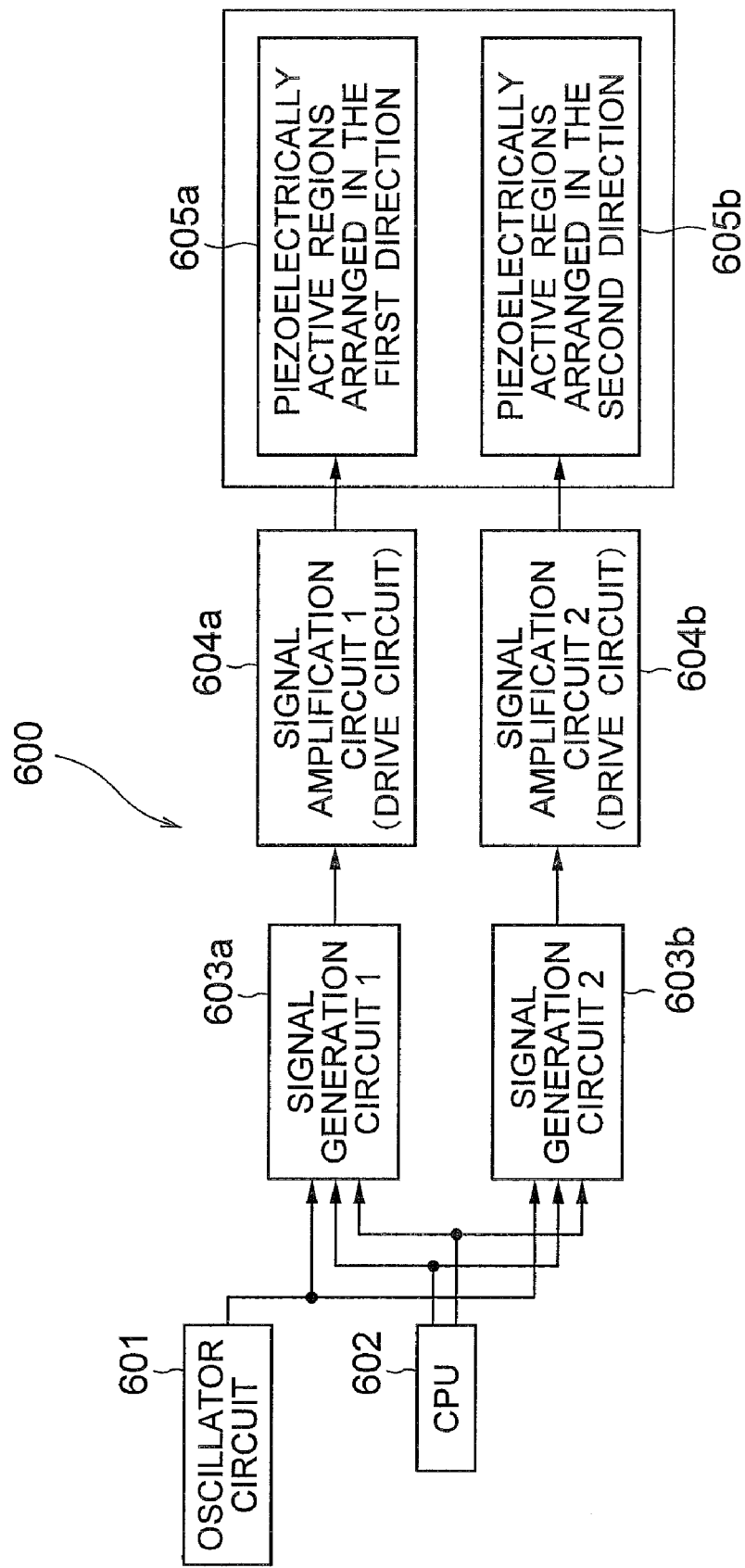
FIG. 6 is a block diagram of a control section.
Figure 7:
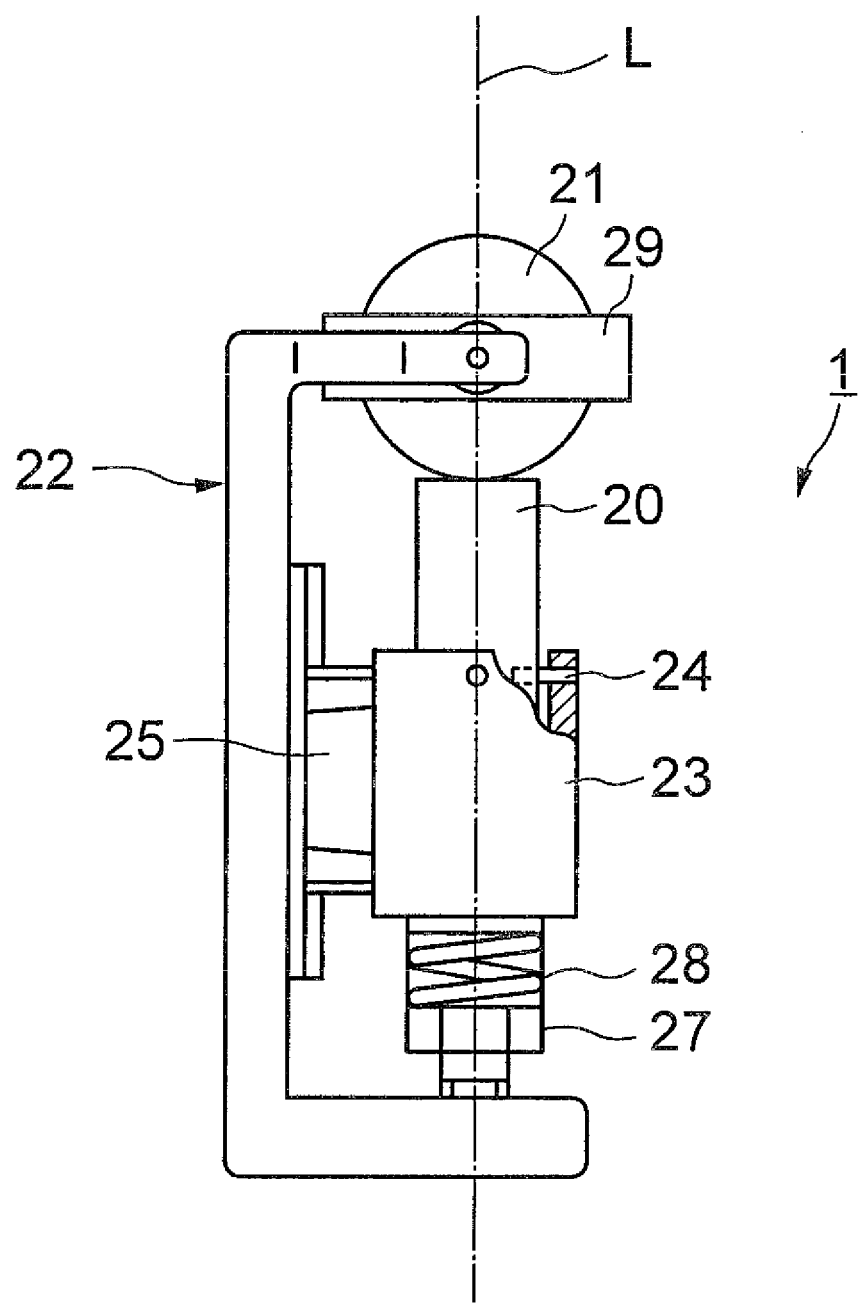
FIG. 7 schematically shows a conventional ultrasonic motor drive apparatus.

FIG. 6 is a functional block diagram of the control section 600. Signals generated by an oscillator circuit 601 and a CPU 602 are input to signal generation circuits 603a, 603b. Signals output from the signal generation circuits 603a and 603b are respectively supplied to the first piezoelectrically active regions 605a arranged in the first direction and the piezoelectrically active regions 605b arranged in the second direction through signal amplification circuits 604a and 604b. The control section 600 applies alternate signals to the piezoelectric element 107 in this way.

As described above, the present invention can suitably be applied to an ultrasonic motor drive apparatus that is easy to assemble and can be driven with multiple degrees of freedom (i.e. with multiple axes).

The present invention can advantageously provide an ultrasonic motor drive apparatus that can drive a driven member with multiple degrees of freedom (or multiple axes) by a single piezoelectric element and can be assembled easily with a decreased number of degrees of freedom in assembly.

What is claimed is:

1. An ultrasonic motor drive apparatus comprising:
a piezoelectric element of a cuboidal shape having a plurality of piezoelectrically active regions arranged along a first direction and a plurality of piezoelectrically active regions arranged along a second direction, in which longitudinal vibration and flexural vibration are induced with application of alternate signals to the plurality of piezoelectrically active regions;
a piezoelectric element holder that is fixedly attached to the piezoelectric element at a position on and in the vicinity of a common node of the longitudinal vibration and the flexural vibration induced in the piezoelectric element;
a vibrator holder having a plurality of openings provided toward the first directional axis and the second directional axis along a plane perpendicular to a third directional axis;

a driven member having a substantially spherical shape that is rotationally driven by elliptical vibration generated by synthesis of the longitudinal vibration and flexural vibration induced on an end face of the piezoelectric element with respect to the third direction;

an output shaft that is attached to the driven member and movable along the third direction in a certain range to transmit power output of the driven member;

a pressing member that brings the driven member and the piezoelectric member into pressure contact with each other with a pressing force acting therebetween along the third direction;

a cap having an opening and disposed at a position opposed to the piezoelectric member and the pressing member with the driven member between along the third direction, the cap receiving a pressing force while guiding the driven member;

a link member one end of which is connected with the pressing member along the third direction and the other end of which can be connected with another apparatus; and a control section that applies an alternate signal to the piezoelectric member.

2. The ultrasonic motor drive apparatus according to claim 1, wherein the piezoelectric element holder is cylindrical in shape and has a substantially cuboidal piezoelectric element insertion opening provided therein into which the piezoelectric element is to be fitted.

3. The ultrasonic motor drive apparatus according to claim 1 or 2, wherein the piezoelectric element holder has two projecting portions that allow the piezoelectric element to which the piezoelectric element holder is attached to be placed in the vibrator holder by the plurality of openings and guided to a position on the third directional axis, the projecting portions being provided at positions at which a center line passing through the center of a circle and the circle intersect at positions opposed to each other along a diametrical direction.

4. The ultrasonic motor drive apparatus according to claim 1, wherein the piezoelectric element holder is made of a resin material or an engineering plastic material.

5. The ultrasonic motor drive apparatus according to claim 1, wherein the plurality of openings of the vibrator holder include a first opening provided along the plane perpendicular to the third directional axis, wherein as the piezoelectric element on which the piezoelectric element holder is fixedly attached is dropped through the first opening, the orientation of the piezoelectric element is regulated and the piezoelectric element can be introduced into the vibrator holder.

6. The ultrasonic motor drive apparatus according to claim 5, wherein the plurality of openings of the vibrator holder include a plurality of second openings that are perpendicular to the third direction and the first direction and provided at positions symmetrical with respect to the third directional axis, engagement of the second openings and the plurality of projecting portions of the piezoelectric element holder causes the piezoelectric element to be placed in the vibrator holder through the first opening, and the center of the piezoelectric member thus guided and the center of the vibrator holder are aligned along the third directional axis by the second openings.

7. The ultrasonic motor drive apparatus according to claim 6, wherein in a state in which the plurality of second openings of the vibrator holder and the plurality of projecting portions of the piezoelectric element holder are in engagement with each other, positioning of the piezoelectric member in the vibrator holder is achieved, the piezoelectric element can move along the third direction, and a structure that allows adjustment of the pressing force by the pressing member and a rotation prevention structure that prevents the piezoelectric member to rotate about the third directional axis are further provided.

8. The ultrasonic motor drive apparatus according to claim 1, wherein the link member can be connected with an output shaft of another ultrasonic motor drive apparatus.

* * * * *